United States Patent [19]

Maruyama

[11] Patent Number: 5,301,134
[45] Date of Patent: Apr. 5, 1994

[54] DIGITAL FILTER CIRCUIT FOR USE IN OVERSAMPLING TYPE ANALOG/DIGITAL CONVERTER

[75] Inventor: Yuichi Maruyama, Kanagawa, Japan
[73] Assignee: NEC Corporation, Tokyo, Japan
[21] Appl. No.: 827,795
[22] Filed: Jan. 30, 1992
[30] Foreign Application Priority Data

Jan. 30, 1991 [JP] Japan ................................ 3-029389

[51] Int. Cl.$^5$ .............................................. G06F 15/31
[52] U.S. Cl. .................................. 364/724.10; 364/736
[58] Field of Search ................. 364/724.1, 724.01, 736

[56] References Cited

U.S. PATENT DOCUMENTS 4,937,577  6/1990  Rich et al. ................. 364/724.1 X
5,157,395 10/1992  Del Signore et al. ....... 364/724.1 X

*Primary Examiner*—Tan V. Mai
*Attorney, Agent, or Firm*—Whitham & Marhoefer

[57] ABSTRACT

A digital filter circuit has two decimation filters, a first and a second, for performing two decimations with respect to a digital data of a predetermined sampling rate. The first decimation filter has a function of producing processing signals for a filter coefficient of the second decimation filter and providing such operational signal to the second decimation filter. Since the output of the first decimation filter is not a coded numeral value but is an output in the form of a processing signal for the filter coefficient of the second decimation filter, the first decimation filter can take the form of a decoder circuit and not an operational circuit and the second decimation filter can be simpler than that having a multiplier circuit of a conventional circuit. The scale of the overall circuit can be reduced and this contributes in the enhancement of high integration of large scale integrated circuits (LSIs), in the scaling down of chip areas and in reducing the manufacturing cost.

4 Claims, 5 Drawing Sheets

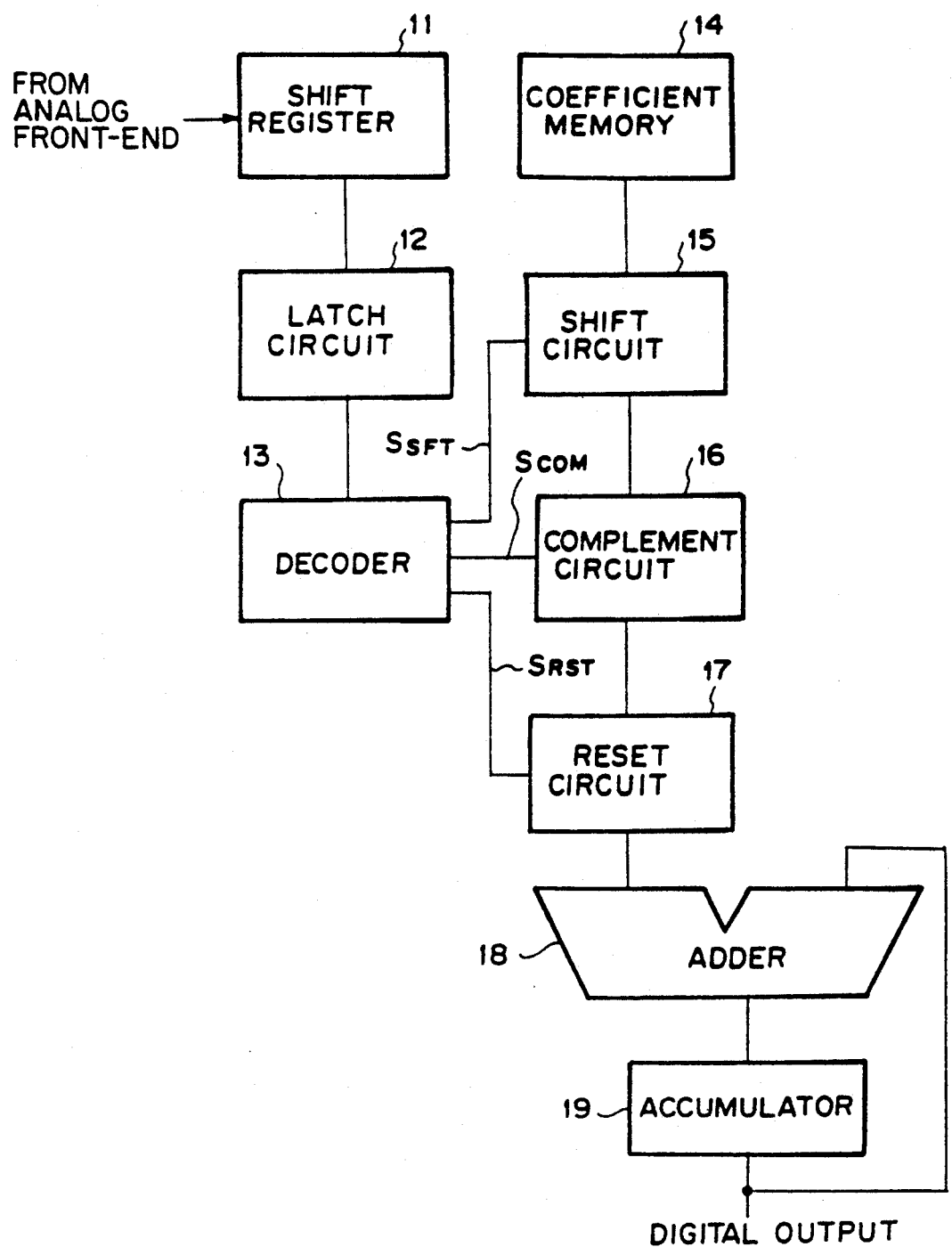

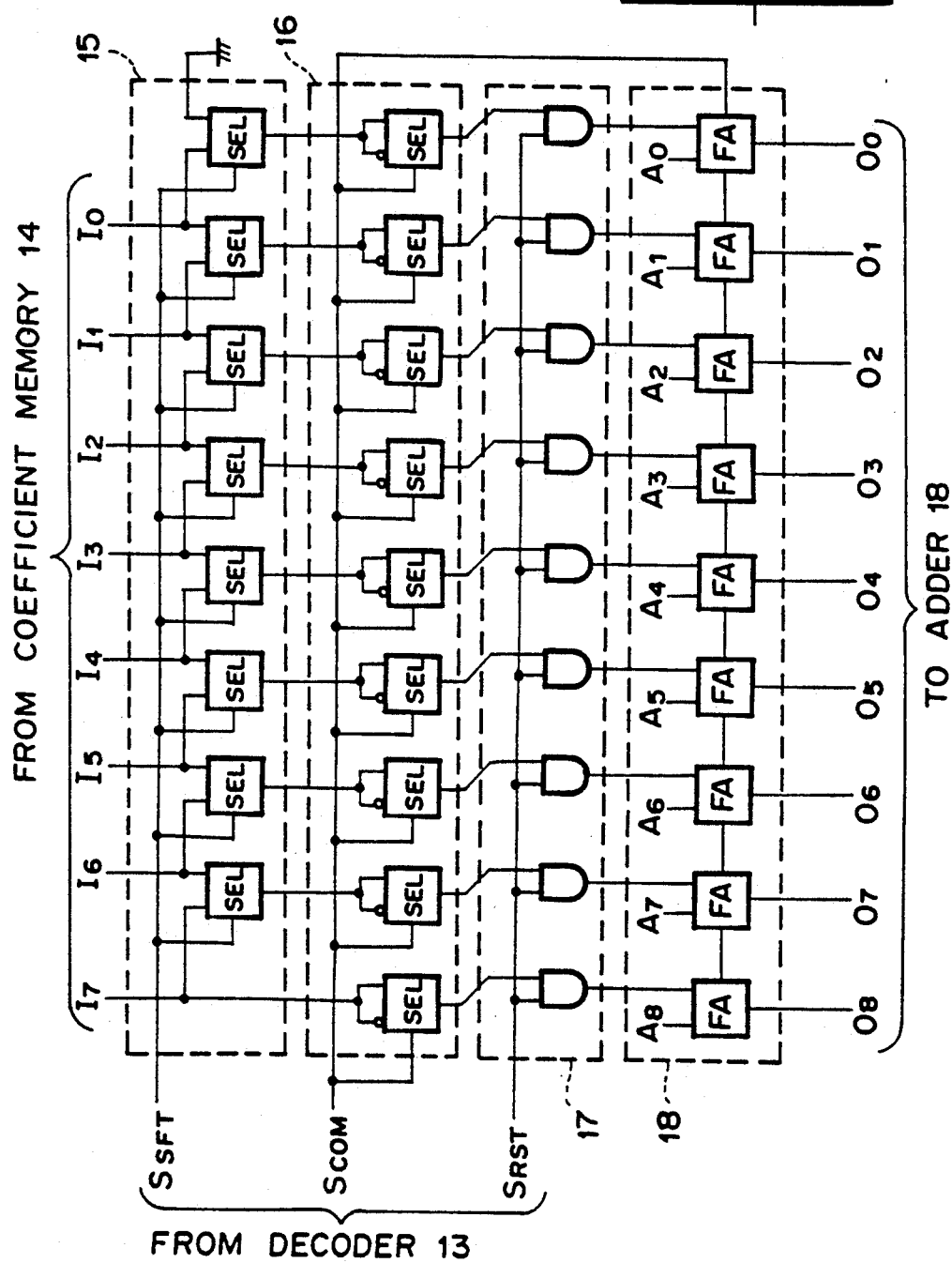

DIGITAL FILTER CIRCUIT FOR USE IN OVERSAMPLING TYPE ANALOG/DIGITAL CONVERTER

BACKGROUND OF THE INVENTION

1. Field of the Invention

The present invention relates to a digital filter circuit for use in an analog to digital converter (hereinafter referred to as an "A/D converter") of an oversampling type and, more particularly, to a decimation filter for converting a digital data of a high sampling rate to that of a low sampling rate.

2. Description of the Related Art

An A/D converter of an oversampling type performs A/D conversion at such a high sampling rate as several tens or several hundreds of times of a normal sampling rate. By performing the conversion at such a high rate, it is possible to spread quantization noise to a wide frequency band. By spreading the quantization noise to a wide frequency band, it is possible to make the quantization noise small at a desired frequency band. This means that the signal to noise ratio (i.e., S/N ratio) can be improved by making a rate of sampling faster if the quantization bit number at the A/D conversion is the same. Thus, the advantage is that, by performing the sampling at a high sampling rate for the realization of the same S/N ratio, it is possible to reduce the quantization bit number at the A/D conversion.

When an analog signal is sampled, the signal whose frequency is higher than ½ of the sampling frequency (Nyquist frequency) is turned back as an unnecessary signal (turn-back noise) within the Nyquist frequency. It is not possible to eliminate the turn-back noise after the sampling process. Therefore, it is necessary to eliminate the signal whose frequency is higher than the Nyquist frequency before the sampling is conducted. The A/D converter which performs A/D conversion at an ordinary sampling rate has required a very high precision analog filter because the signal frequency band and the Nyquist frequency therefor are substantially the same with each other. However, the A/D conversion circuit of an oversampling type has the advantage that the analog filter to be used can be a comparatively simple one because the signal band and the Nyquist frequency therefor are largely different from each other.

Each of the two advantages mentioned above makes it possible to form the analog circuits simpler so that the A/D conversion circuit of an oversampling type is widely used as a circuit suited to the realization of the semiconductor integrated circuit (the realization of LSIs).

The output data converted by the A/D converter of an oversampling type is a data of a low word (e.g., 1 bit) and of a high sampling rate. This data is excised to a data of a desired sampling rate which is ordinarily used. At this time, if the data of a high sampling rate as it stands is excised and the resultant data is made a data of the desired sampling rate, all of the quantization noise spreading in a wide region turns back into the Nyquist frequency (within the signal band) of the desired sampling rate because the data is processed by a high sampling rate, which causes the input signal to be deteriorated. In order to prevent this, it is necessary that, before the data is excised, the quantization noise distributed outside the signal region be attenuated. A digital filter is used as a means to perform the attenuation but, in doing so, if an attempt is made to obtain the data of the desired sampling rate at one decimation, the digital filter required must have a very high precision. The characteristics required by such filter must unavoidably be that a passing band is narrow, a block band is very wide and a transfer band is very narrow. The realization of filter having such characteristics is technically difficult. Thus, generally, in order to make the characteristics of the digital filter simple, the decimation is performed not only one time but several times. When the decimation is performed several times, the characteristics of the filter for effecting the decimation to an intermediate frequency can be simple because not all the quantization noise is turned back into the signal region so that, generally, a simple filter called a moving average filter is used. It is comparatively easy to realize also a filter for effecting the decimation from the intermediate frequency to a desired frequency as such filter is not extreme in the ratio of the passing band, the blocking band and the transfer band as compared with the filter used when the data of a desired sampling rate is obtained by the one time decimation. In this connection, there is shown in FIG. 1 an example of the related circuit configuration composed of an analog front-end stage (ΔΣ-modulator) F0, a first decimation filter F1 and a second decimation filter F2. An example of the filtering characteristics of the first decimation filter F1 is as shown in FIG. 2(a) and that of the second decimation filter F2 is as shown in FIG. 2(b). FIG. 3 shows a detailed block diagram of the first and second decimation filters F1, F2 shown in FIG. 1. The first decimation filter F1 is formed by a shift register 1, a latch circuit 2 and a decoder 3, and the second decimation filter F2 is formed by a coefficient memory 4, a multiplier 5, an adder 8 and an accumulator 9. A further detailed circuit diagram of the multiplier 5 which is formed by a plurality of gates. full adders represented by a symbol FA and half adders represented by a symbol HA is shown in FIG. 4. Each of the full adders FA has input terminals A, B for receiving an adding value and a value to be added thereto, input and output terminals CI, C0 for a carry signal, and output terminal S for outputting the resultant added value as shown in FIG. 5(a), and each of the half adder HA has input terminals A, B for receiving an adding value and a value to be added thereto, an output terminal C0 for the carry signal, and an output terminal S for outputting the resultant added value as shown in FIG. 5(b).

As above, the object of the circuit of an oversampling type is to convert a digital data of a high sampling rate to a digital data of a desired sampling rate by conducting the decimation several times. In such a conventional circuit, the several decimations are performed independently from one another such that, upon completion of the operation by a first decimation, its output data is merely processed as an input to the next decimation filter so that a problem herein is that the operation circuit concerned inevitably becomes large and complicated.

SUMMARY OF THE INVENTION

It is, therefor, an object of the invention to overcome the problems existing in the conventional filter circuit and to provide an improved filter circuit for use in an oversampling type A/D converter.

It is another object of the invention to provide a digital filter circuit which is realized by an operation circuit of a small scale.

According to one aspect of the invention, there is provided a digital filter circuit which has two stage conversion means for performing two decimations with respect to a digital data of a predetermined sampling rate, the first stage conversion means having a function of producing a processing signal for a filter coefficient of the second stage conversion means and providing such processing signal to the second stage conversion means.

As an output of the first decimation filter, instead of issuing an output data of a numerical value after filter operation, a processing signal for the filter coefficient of the next decimation filter is outputted. In this way, the result obtained is equivalent to that obtained by performing the first time filter operation and the second time filter operation independently from each other.

According to the present invention, since the output of the first decimation filter is not a coded numerical value but is an output in the form of a processing signal for the filter coefficient of the second decimation filter, the first decimation filter can take the form of a decoder circuit and not an operational circuit and the second decimation filter can be simpler than that having a multiplier circuit. The scale of the overall circuit can be reduced to about ½ and this contributes in the enhancement of high integration of LSIs, in the scaling down of chip areas occupied thereby and in reducing the cost of manufacture.

BRIEF DESCRIPTION OF THE DRAWINGS

The above and other objects, features and advantages of the present invention will be apparent from the following description of a preferred embodiment of the invention, with reference to the accompanying drawings, in which:

FIG. 6 shows a block diagram showing a circuit arrangement of an embodiment according to the present invention;

FIG. 7 shows a detailed circuit diagram of a part of a second decimation filter shown in FIG. 6; and FIG. 8 shows input and output terminals of a selector shown in FIG. 7.

PREFERRED EMBODIMENTS OF THE INVENTION

Figure 1:
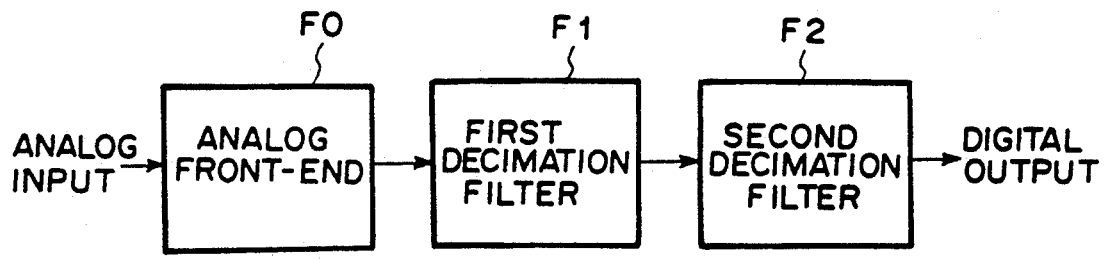
FIG. 1 is a block diagram showing an arrangement of a conventional digital filter.
Figure 2A:
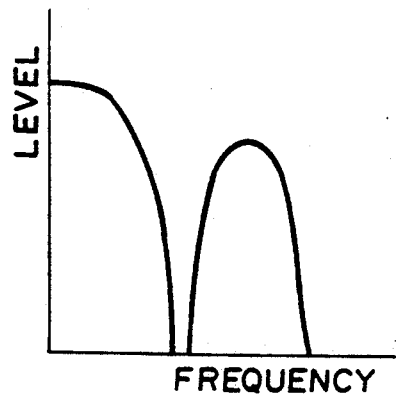
FIGS. 2(a) and 2(b) show typical examples of filtering characteristics of first and second decimation filters, respectively, shown in FIG. 1.
Figure 2B:
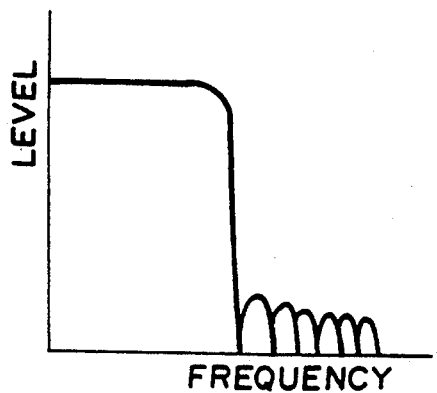

Now, preferred embodiment will be explained with reference to the accompanying drawings.

FIG. 6 diagrammatically shows a circuit configuration of an embodiment according to the present invention. This circuit is for a filter by which an inputted digital data of a predetermined sampling rate is made 1/K first and 1/L next (K and L both being natural numbers).

That is, as shown in FIG. 6, the circuit of this embodiment is provided with two conversion means for performing two time decimations with respect to a digital data of a predetermined sampling rate and the first stage conversion means produces a processing signal for a filter coefficient of the second stage conversion means and provides such processing signal to the second stage conversion means.

The first stage conversion means, that is, the first decimation filter comprises a shift register 11, a latch circuit 12, and a decoder 13, and the second stage conversion means, that is, the second decimation filter comprises a coefficient memory 14, a shift circuit 15, a complement circuit 16, a reset circuit 17, an adder 18 and an accumulator 19. The characteristic portions of the circuit according to the present invention, that is, the shift circuit 15, the complement circuit 16 and the reset circuit 17 are shown in FIG. 7 in detail, wherein the shift circuit 15 and the complement circuit 16 are basically formed by a plurality of selectors each represented by a symbol SEL as shown in FIG. 7, and the reset circuit 17 is formed by a plurality of AND gates.

Next, the operation of the circuit of this embodiment is explained. It is assumed that $1/K = \frac{1}{2}$ and the transfer function of the first decimation filter of the moving average filter is $\frac{1}{4}(1+Z^{-1})^2$, this transfer function being rewritten further as $(0.25 \cdot Z^{-0} + 0.5 \cdot Z^{-1} + 0.25 \cdot Z^{-2})$. It is further assumed that $1/L = \frac{1}{8}$ and the transfer function of the second decimation filter of FIR (Finite Impulse Response) filter having the tap-number of 32 is $(K_0 \cdot Z^{-0} + K_1 \cdot Z^{-1} + K_2 \cdot Z^{-2} + K_{30} \cdot Z^{-30} + K_{31} \cdot Z^{-31})$ ($K_0 \sim K_{31}$ being given filter coefficients of 1 word 8 bits). The input is one in which 1 word 1 bit data is inputted and the value of "+1" is taken at a high level and that of "−1" is taken at a low level.

First, the operation for obtaining an output of the first decimation filter is explained hereunder. In order to obtain the output of the first decimation filter, the operation is made based on the following formula (1) from the above transfer function of the circuit:

$$0.25 \times \text{(the data inputted now)} + \quad (1)$$
$$0.5 \times \text{(the data inputted one time before)} +$$
$$0.25 \times \text{(the data inputted two times before)}$$

Since the first decimation is ½ and it is only necessary to obtain an output once in two times input data, it is sufficient that the operation according to the above formula (1) be conducted once in two times input data and the result of the operation be outputted.

Figure 3:
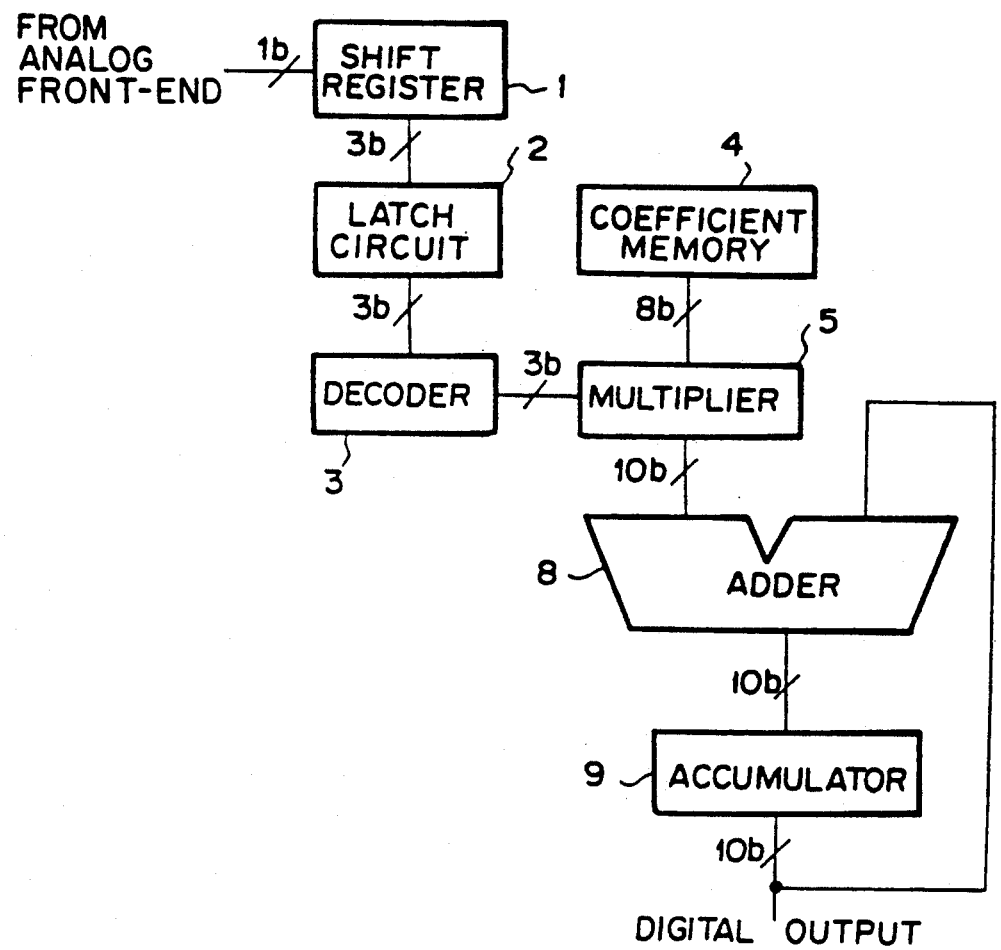
FIG. 3 is a detailed block diagram of the conventional decimation filter.
Figure 5A:
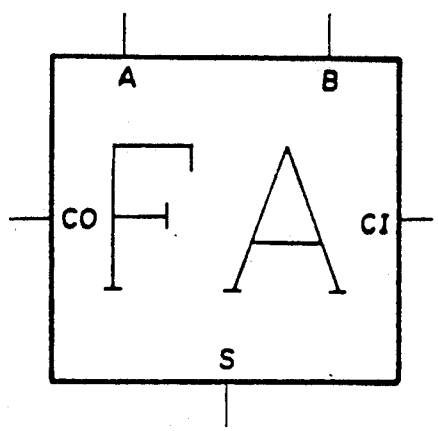
FIGS. 5(a) and 5(b) show input and output terminals of a full adder and a half adder, respectively, shown in FIG. 4.
Figure 5B:
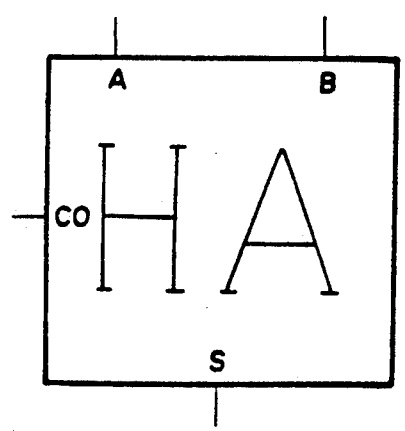
Figure 4:
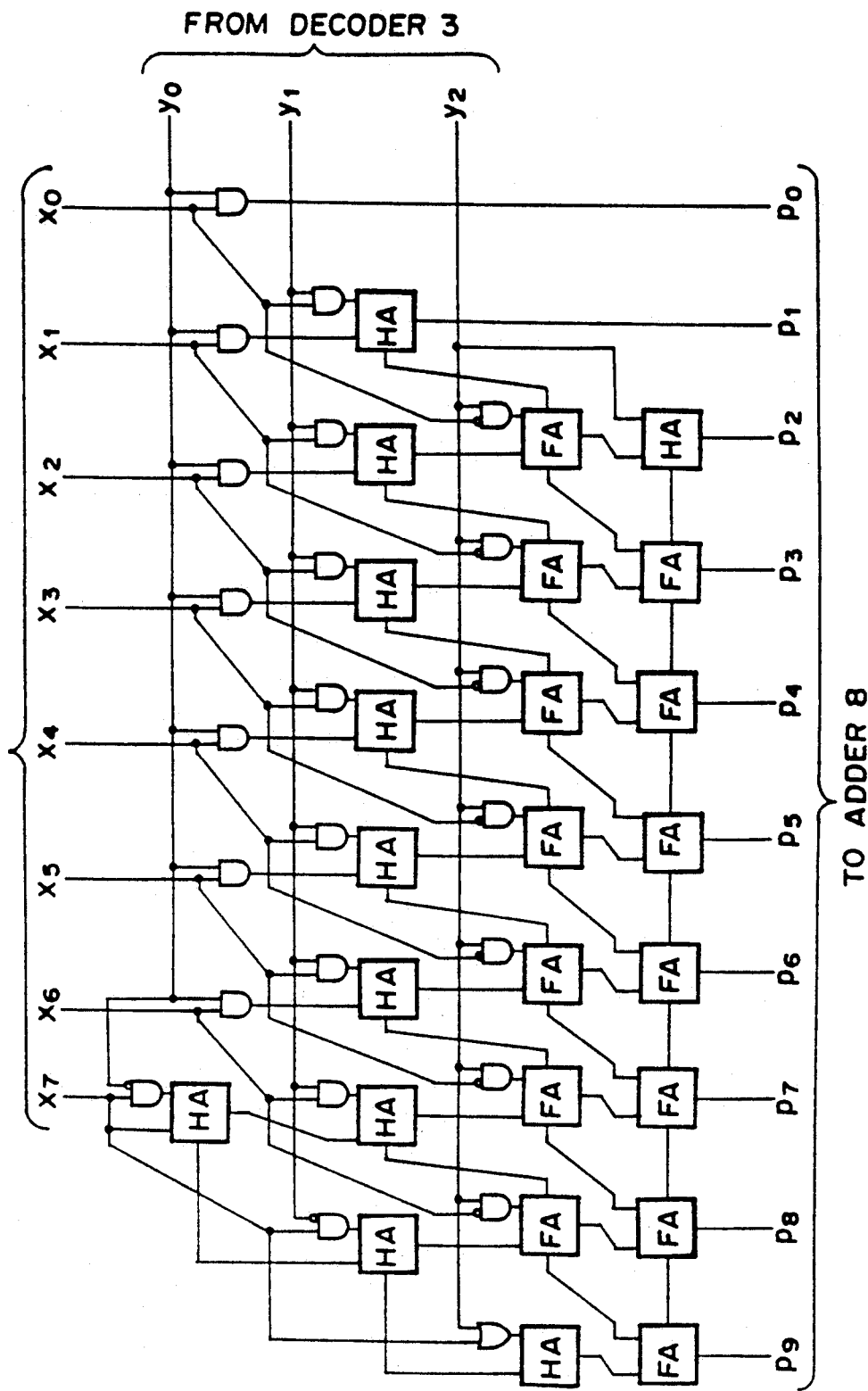
FIG. 4 is a detailed circuit diagram of a multiplier used in the decimation filter shown in FIG. 3.

The combination of the shift register 11, the latch circuit 12 and the decoder 13 of the circuit of the invention shown in FIG. 6 corresponds to the first decimation filter formed by the shift register 1, the latch circuit 2 and the decoder 3 of the conventional circuit shown in FIG. 3. In the circuit shown in FIG. 6, the digital input data is inputted to the shift register 11. This shift register 11 is a circuit for storing three data to be used in the filtering operation and is constituted by 3-bit shift register. The data in the shift register 11 are shifted for each input data. The latch circuit 12 is also constituted by 3 bits. As the first decimation is ½, the latch circuit 12 latches the output of the shift register 11 one time per two times of data input thereto. At the latch circuit 12, the output thereof is already decimated to ½. Next, the outputs of the first decimation filter are obtained from the decoder 13. The truth table of the decoder 13 under this state is given in the following Table 1. The actual output values which are the operational result of the formula (1) are also shown therein.

TABLE 1

| INPUT | | | OUTPUT | | | |
|---|---|---|---|---|---|---|
| $Z^{-0}$ | $Z^{-1}$ | $Z^{-2}$ | SHIFT | COMPLE-MENT | RESET | ACTUAL OUTPUT |
| 0 | 0 | 0 | 0 | 1 | 0 | −1 |
| 0 | 0 | 1 | 1 | 1 | 0 | −0.5 |
| 0 | 1 | 0 | 0 | 0 | 1 | 0 |
| 0 | 1 | 1 | 1 | 0 | 0 | 0.5 |
| 1 | 0 | 0 | 1 | 1 | 0 | −0.5 |
| 1 | 0 | 1 | 0 | 0 | 1 | 0 |
| 1 | 1 | 0 | 1 | 0 | 0 | 0.5 |
| 1 | 1 | 1 | 0 | 0 | 0 | 1.0 |

In the above Table 1, the input $Z^{-0}$ corresponds to the data inputted now, the input $Z^{-1}$ to the data inputted one time before, and the $Z^{-2}$ to the data inputted two times before.

Next, the operation for obtaining an output of the second decimation filter is explained. In order to obtain the output of the second decimation filter, the operation from the transfer function of the circuit explained above is made on the following formula (2):

$$K_0 \times \text{(data from the first decimation filter outputted now)} +$$
$$K_1 \times \text{(data from the first decimation filter outputted one time before)} +$$
$$K_2 \times \text{(data from the first decimation filter outputted two times before)}$$
$$\vdots$$
$$+$$
$$K_{30} \times \text{(data from the first decimation filter outputted thirty times before)} +$$
$$K_{31} \times \text{(data from the first decimation filter outputted thirty one times before)}$$

(2)

Since the second decimation is ⅛ and it is only necessary to obtain an output once in 8 times of the input data, it is sufficient that the operation of the formula (2) be conducted once in 8 times of the input data. By confirming in light of the Table 1, the output values of the first decimation filter can be appreciated as being either ±1, ±0.5 or 0. The multiplication of either ±1, ±0.5 or 0 with the filter coefficient can be realized by either one of the taking of complement of the filter coefficient, the shifting of one-bit right and the resetting, or by a plurality of operations thereof. According to the present invention, the output of the first decimation filter is not an output of a code of "±1", "±0.5" or "0" but is an output of a processing signal of a complement ($S_{COM}$), shift ($S_{SFT}$) and reset ($S_{RST}$) in accordance with the Table 1.

The portion represented by the numerals 14 through 19 in the embodiment shown in FIG. 6 according to the present invention corresponds to the second decimation filter represented by the numerals 4 through 9 of the conventional circuit shown in FIG. 3. In FIG. 6, the coefficient memory 14 is a memory circuit for storing the coefficients $K_0 \sim K_{31}$ of the second decimation filter. Each time the processing data or signal ($S_{SFT}$, $S_{COM}$, $S_{EST}$) which is an output of the first decimation filter is outputted, the coefficient memory 4 sequentially outputs coefficients one at a time. The coefficients outputted from the coefficient memory 14 are subjected to the operation according to the processing signals ($S_{SFT}$, $S_{COM}$, $S_{RST}$) outputted from the first decimation filter, and thereafter they are inputted into the adder 18. At this time, the accumulator 19 has been reset in advance. This operation is continued until all the coefficients of the second decimation filter are read out whereby the output is obtained after all the coefficients are accumulated. After the output is obtained, the accumulator 19 is reset and the above-explained operation is repeated. However, in this operation, the output is obtained only once in 32 times of outputs of the first decimation filter. The second decimation filter is decimated ⅛ so that the output must be obtained once in 8 times. If a circuit with which the coefficients are shifted by 8 taps is used and four of such circuit are provided, the scale of the overall circuit will become large. Thus, by increasing the operational speed of the second decimation filter to 4 times, by outputting 4 times the coefficients shifted by 8 outputs with respect to 1 output of the first decimation filter, and by carrying out the operation by 4 accumulators, it is possible to obtain one output with respect to 8 outputs of the first decimation filter.

That is, in the circuit according to the present invention, the conventional structure of the multiplier 5 shown in FIG. 3 is replaced by the shift circuit 15, the complement circuit 16 and the reset circuit 17, which directly receive the shift signal $S_{SFT}$, the complement signal $S_{COM}$, and the reset signal $S_{RST}$, respectively, all outputted from the decoder 13 of the first decimation filter. Specifically, the operations conducted on the coefficients are: as it is in the case of "+1"; a complement operation in the case of "−1": a 1-bit right shift operation in the case of "+0.5"; a combination of the 1-bit right shift operation and the complement operation in the case of "−0.5", and a reset operation in the case of "0".

Thus, in the arrangement of this embodiment, the output of the first decimation filter is a processing signal ($S_{SFT}$, $S_{COM}$, $S_{RST}$) applied to the coefficient of the second decimation filter in stead of the resultant of the operation of the filter, so that the scale of the overall circuit can be made small.

While the invention has been described in its preferred embodiments, it is to be understood that the words which have been used are words of description rather than limitation and changes within the purview of the appended claims may be made without departing from the true scope and spirit of the invention in its broader aspects.

What is claimed is:

1. A digital filter circuit having a first stage conversion means and a second stage conversion means for performing two decimations with respect to a digital data of a predetermined sampling rate, said first stage conversion means having a function of producing a first processing signal for a shift operation, a second processing signal for a complement operation and a third processing signal for a reset operation for a filter coefficient of said second stage conversion means and providing such processing signals to said second stage conversion means.

2. A digital filter circuit according to claim 1, in which said first stage conversion means conducting a first decimation comprises a shift register receiving an input digital signal, a latch circuit for latching an output of said shift register, and a decoder receiving an output of said latch circuit and producing said first to third processing signals outputted to said second stage conversion means.

3. A digital filter circuit according to claim 1, in which said second stage conversion means conducting a second decimation comprises a coefficient memory for storing coefficients and sequentially outputting said coefficients one at a time; a shift circuit for receiving said coefficient from said coefficient memory and said first processing signal from said first stage conversion means: a complement circuit for receiving an output from said shift circuit and said second processing signal from said first stage conversion means; a reset circuit for receiving an output from said complement circuit and said third processing signal from said first stage conversion means; an adder for receiving an output from said reset circuit; and an accumulator for receiving an output from said adder.

4. A digital filter circuit having a first stage conversion means and a second stage conversion means for performing two decimations with respect to a digital data of a predetermined sampling rate, said first stage conversion means having a function of producing a first, a second and a third processing signal for a filter coefficient of said second stage conversion means and providing such processing signals to said second stage conversion means, said second stage conversion means comprising a coefficient memory for storing coefficients and sequentially outputting said coefficients one at a time, a shift circuit which receives said coefficients from said coefficient memory and said first processing signal from said first stage conversion means and which includes a plurality of selectors each receiving at its select signal input terminal said first processing signal, a complement circuit which receives an output from said shift circuit and said second processing signal from said first stage conversion means and which includes a plurality of selectors each receiving at its select signal input terminal said second processing signal, a reset circuit which receives an output from said complement circuit and said third processing signal from said first stage conversion means and which includes a plurality of AND gates each receiving at its one input terminal and said third processing signal, an adder for receiving an output from said reset circuit, and an accumulator for receiving an output from said adder.

* * * * *